United States Patent
Bal et al.

(10) Patent No.: US 8,045,643 B1
(45) Date of Patent: Oct. 25, 2011

(54) FORWARD AND REVERSE VSWR INSENSITIVE POWER DETECTION USING QUADRATURE DOWNCONVERSION

(75) Inventors: Steven R. Bal, Cary, NC (US); Marcus Granger-Jones, Scotts Valley, CA (US)

(73) Assignee: RF Micro Devices, Inc., Greensboro, NC (US)

( * ) Notice: Subject to any disclaimer, the term of this patent is extended or adjusted under 35 U.S.C. 154(b) by 845 days.

(21) Appl. No.: 12/113,981

(22) Filed: May 2, 2008
(Under 37 CFR 1.47)

Related U.S. Application Data

(60) Provisional application No. 60/915,970, filed on May 4, 2007.

(51) Int. Cl.
*H04L 25/49* (2006.01)

(52) U.S. Cl. .................. 375/297; 455/114.3

(58) Field of Classification Search .......... 375/296, 375/297; 455/114.3, 127.1–127.3, 572
See application file for complete search history.

(56) References Cited

U.S. PATENT DOCUMENTS

| | | | | |
|---|---|---|---|---|
| 5,913,154 | A * | 6/1999 | Wynn | 455/127.2 |
| 7,379,714 | B2 * | 5/2008 | Haque et al. | 455/107 |
| 7,555,276 | B2 * | 6/2009 | Wilcox | 455/276.1 |
| 7,656,964 | B1 * | 2/2010 | DeCoste et al. | 375/297 |

* cited by examiner

*Primary Examiner* — David Lugo
(74) *Attorney, Agent, or Firm* — Withrow & Terranova, P.L.L.C.

(57) ABSTRACT

A system and method for detecting both the forward and reverse power of a power amplifier are provided. The power amplifier is a quadrature power amplifier including an in-phase amplifier circuit and a quadrature-phase amplifier circuit. A radio frequency (RF) input signal is split and phase-shifted to provide an in-phase RF input to the in-phase amplifier circuitry and a quadrature-phase RF input to the quadrature-phase amplifier circuitry, where the quadrature-phase RF input is +90 degrees out-of-phase with the in-phase RF input. In one embodiment, a power detection system operates to downconvert quadrature output signals from the in-phase and quadrature-phase amplifier circuits based on quadrature local oscillator signals. The outputs of the quadrature downconversion are then selectively combined to provide a quadrature signal indicative of forward power, a quadrature signal indicative of reverse power, or both a quadrature signal indicative of forward power and a quadrature signal indicative of reverse power.

26 Claims, 7 Drawing Sheets

FORWARD AND REVERSE VSWR INSENSITIVE POWER DETECTION USING QUADRATURE DOWNCONVERSION

This application claims priority to U.S. provisional patent application Ser. No. 60/915,970, filed May 4, 2007, the disclosure of which is incorporated herein by reference in its entirety.

FIELD OF THE INVENTION

The present invention relates to detecting the output power of a power amplifier in a radio frequency (RF) transmitter.

BACKGROUND OF THE INVENTION

The output power of a transmitter in a wireless communication link is largely determined by the power amplifier (PA) and the load impedance seen at the output of the PA. For open loop PAs, variations in load impedance will result in variations in the output power. Ideally, the load impedance is constant. However, in reality, the load impedance may vary due to variations in the impedance of the components in the transmit chain following the power amplifier, such as a duplexer, caused by frequency and temperature variations. The load impedance may also vary due to variations in the impedance of the antenna caused by proximity of the antenna to foreign metallic objects and the user's body. For a mobile handset communication link, output power variations decrease the quality of service, increase the probability of dropped calls in fringe areas, increase the liability of the mobile terminal manufactures in terms of tolerated output power versus Specific Absorption Ratio (SAR), and increase the peak current of the PA.

There are several methods to reduce output power variation due to load impedance variation. One method is to insert an isolator between the PA output and the antenna. However, the isolator is an additional component that increases board area and cost. In addition, the isolator adds loss to the transmit path, thereby decreasing the efficiency of the transmitter. Another method is to add a radio frequency (RF) power control loop. Common RF power control loops consist of a directional coupler and a RF power detector, where the output of the RF power detector is used to control the output power of the PA. Like the isolator, a directional coupler is an additional component that increases cost and adds loss to the transmit path, which decreases the efficiency of the transmitter. By using a directional coupler, which is used to separate forward power from reverse power at the PA output, and a power control loop, the transmitter can provide constant forward power to the antenna. However, in order to provide constant delivered power to the antenna, a dual directional coupler is necessary in order to measure the forward and reflected power at the output of the PA. The insertion loss of a dual directional coupler is twice that of a single directional coupler (in dB). As such, a dual directional coupler further decreases the efficiency of the transmitter.

In addition, testing of mobile devices is becoming increasingly more stringent and, as a result, over-the-air (OTA) testing is now being standardized to further test performance. As OTA testing is developing, Total Radiated Power (TRP) is becoming increasingly important. The TRP of a mobile device is an integral measure of the radiation pattern emitted by the device during transmit operation while in a real-world, or a simulated real-world, environment.

Thus, there is a need for a system and method for detecting forward and reverse power of a RF transmitter that is insensitive to variations in load impedance, adds minimal insertion loss to the transmit path, and adds minimal cost.

SUMMARY OF THE INVENTION

The present invention provides a system and method for detecting both the forward and reverse power of a power amplifier. In general, the power amplifier is a quadrature power amplifier including an in-phase amplifier circuit and a quadrature-phase amplifier circuit. A radio frequency (RF) input signal is split and phase-shifted to provide an in-phase RF input to the in-phase amplifier circuitry and a quadrature-phase RF input to the quadrature-phase amplifier circuitry, where the quadrature-phase RF input is essentially +90 degrees out-of-phase with the in-phase RF input. In one embodiment, a power detection system operates to downconvert quadrature output signals from the in-phase and quadrature-phase amplifier circuits based on quadrature local oscillator signals. The outputs of the quadrature downconversion are then selectively combined to provide a quadrature signal indicative of forward power, a quadrature signal indicative of reverse power, or both a quadrature signal indicative of forward power and a quadrature signal indicative of reverse power.

More specifically, in one embodiment, the power detection system includes first and second quadrature downconversion circuits. The first quadrature downconversion circuit operates to downconvert an in-phase output signal from the in-phase amplifier circuit and a quadrature-phase output signal from the quadrature-phase amplifier circuit based on a first local oscillator signal to provide first and second downconverted signals, respectively. The second quadrature downconversion circuit operates to downconvert the in-phase output signal and the quadrature-phase output signal based on a second local oscillator signal that is essentially −90 degrees out-of-phase with the first local oscillator signal to provide third and fourth downconverted signals, respectively. Then, either in the digital or analog domain, the first and fourth downconverted signals may be subtracted such that reverse components of the first and fourth downconverted signals essentially cancel to provide an in-phase signal indicative of forward power. The second and third downconverted signals may be added such that the reverse components of the second and third downconverted signals essentially cancel to provide a quadrature-phase signal indicative of forward power, where the in-phase and quadrature-phase signals indicative of forward power form a quadrature forward power detection signal. Similarly, the first and fourth downconverted signals may be added such that forward components of the first and fourth downconverted signals essentially cancel to provide an in-phase signal indicative of reverse power. The second and third downconverted signals may be subtracted such that the forward components of the second and third downconverted signals essentially cancel to provide a quadrature-phase signal indicative of reverse power, where the in-phase and quadrature-phase signals indicative of reverse power form a quadrature reverse power detection signal.

In another embodiment of the present invention, the power detection system includes a forward power detection system. The forward power detection system applies phase-shifting to at least one of the in-phase and quadrature-phase output signals from the in-phase and quadrature-phase amplifier circuits such that forward components of the in-phase and quadrature-phase output signals are essentially 0 degrees out-of-phase and reverse, or reflected, components are essentially 180 degrees out-of-phase. The phase-shifted signals are then combined to provide a signal indicative of forward power.

The signal indicative of forward power is then downconverted to either baseband or a desired Intermediate Frequency (IF) by quadrature downconversion circuitry based on in-phase and quadrature-phase local oscillator signals to provide a quadrature forward power detection signal.

The power detection system may also include a reverse power detection system. The reverse power detection system applies phase-shifting to the in-phase and quadrature-phase output signals from the in-phase and quadrature-phase amplifier circuits such that the forward components of the in-phase and quadrature-phase output signals are essentially 180 degrees out-of-phase and the reverse, or reflected, components are essentially 0 degrees out-of-phase. The phase-shifted signals are then combined to provide a signal indicative of reverse power. The signal indicative of reverse power is then downconverted to either baseband or a desired Intermediate Frequency (IF) by quadrature downconversion circuitry based on in-phase and quadrature-phase local oscillator signals to provide a quadrature reverse power detection signal.

In a similar embodiment, the forward and reverse power detection systems may downconvert the in-phase and quadrature-phase output signals from the in-phase and quadrature-phase amplifier circuits from RF to a desired IF prior to applying phase-shifting. The phase-shifting and selective combination of the phase-shifted signals may then be performed in the analog domain, the digital domain, or in a combination of the analog and digital domains to provide a signal indicative of forward power, a signal indicative of reverse power, or both a signal indicative of forward power and a signal indicative of reverse power.

Those skilled in the art will appreciate the scope of the present invention and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the invention, and together with the description serve to explain the principles of the invention.

DETAILED DESCRIPTION OF THE PREFERRED EMBODIMENTS

The embodiments set forth below represent the necessary information to enable those skilled in the art to practice the invention and illustrate the best mode of practicing the invention. Upon reading the following description in light of the accompanying drawing figures, those skilled in the art will understand the concepts of the invention and will recognize applications of these concepts not particularly addressed herein. It should be understood that these concepts and applications fall within the scope of the disclosure and the accompanying claims.

Figure 1:
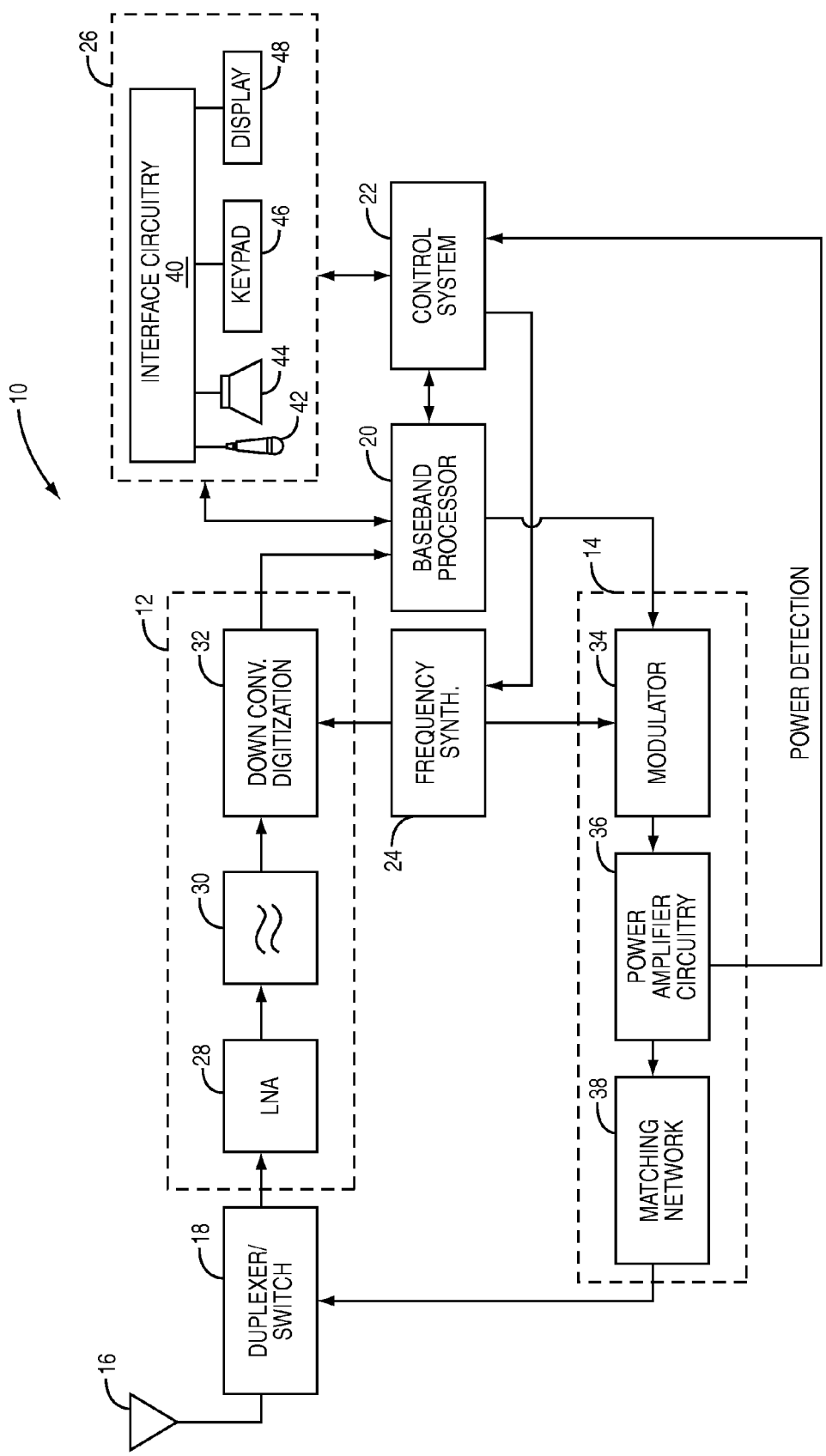
FIG. 1 illustrates an exemplary mobile terminal including a radio frequency (RF) transmitter section incorporating a power detection system for detecting forward power, reverse power, or both forward and reverse power according to one embodiment of the present invention.

The present invention may be incorporated in a mobile terminal 10, such as a mobile telephone, wireless personal digital assistant, wireless Local Area Network (LAN) device, wireless base station, or like wireless communication device. The basic architecture of the mobile terminal 10 is represented in FIG. 1 and may include a receiver front end 12, a radio frequency transmitter section 14, an antenna 16, a duplexer or switch 18, a baseband processor 20, a control system 22, a frequency synthesizer 24, and an interface 26. The receiver front end 12 receives information bearing radio frequency signals from one or more remote transmitters provided by a base station. A low noise amplifier 28 amplifies the signal. A filter circuit 30 minimizes broadband interference in the received signal, while downconversion and digitization circuitry 32 downconverts the filtered, received signal to an intermediate or baseband frequency signal, which is then digitized into one or more digital streams. The receiver front end 12 typically uses one or more mixing frequencies generated by the frequency synthesizer 24. The baseband processor 20 processes the digitized received signal to extract the information or data bits conveyed in the received signal. This processing typically comprises demodulation, decoding, and error correction operations. As such, the baseband processor 20 is generally implemented in one or more digital signal processors (DSPs).

On the transmit side, the baseband processor 20 receives digitized data, which may represent voice, data, or control information, from the control system 22, which it encodes for transmission. The encoded data is output to the radio frequency transmitter section 14, where it is used by a modulator 34 to modulate a carrier signal that is at a desired transmit frequency. Power amplifier circuitry 36 amplifies the modulated carrier signal to a level appropriate for transmission, and delivers the modulated carrier signal to the antenna 16 through a matching network 38 and the duplexer or switch 18.

A user may interact with the mobile terminal 10 via the interface 26, which may include interface circuitry 40 associated with a microphone 42, a speaker 44, a keypad 46, and a display 48. The interface circuitry 40 typically includes analog-to-digital converters, digital-to-analog converters, amplifiers, and the like. Additionally, it may include a voice encoder/decoder, in which case it may communicate directly with the baseband processor 20. The microphone 42 will typically convert audio input, such as the user's voice, into an electrical signal, which is then digitized and passed directly or indirectly to the baseband processor 20. Audio information encoded in the received signal is recovered by the baseband processor 20 and converted by the interface circuitry 40 into an analog signal suitable for driving the speaker 44. The keypad 46 and display 48 enable the user to interact with the mobile terminal 10, input numbers to be dialed, address book information, or the like, as well as monitor call progress information.

The present invention provides an efficient way to detect the transmit power provided by the power amplifier circuitry 36 that is tolerant to variations in load impedance seen at the input to the duplexer or switch 18 resulting from changes in frequency, temperature, and the environment to which the antenna 16 is exposed. A discussed below, one or more signals indicative of forward power, reverse power, or both forward and reverse power from the power amplifier circuitry 36 are fed back to the control system 22, which may react accordingly to control input signal levels, bias, gain, or a combination thereof in traditional fashion to control transmit power. Note that in the linear domain, rather than the logarithmic domain, forward power minus reverse power is equal to delivered power.

Figure 2:
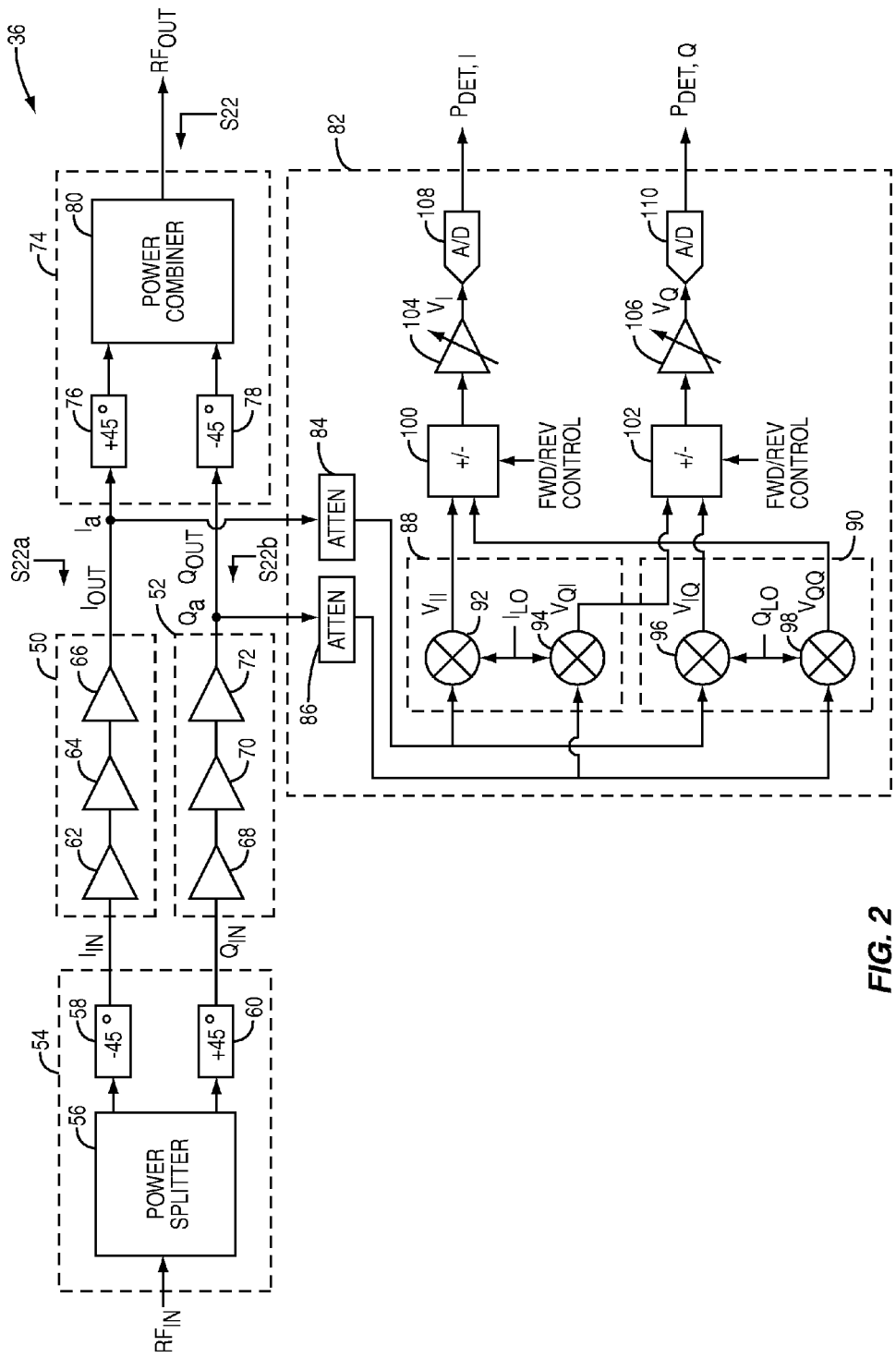
FIG. 2 illustrates power amplifier circuitry including a power detection system according to a first exemplary embodiment of the present invention.

As illustrated in FIG. 2, the power amplifier circuitry 36 is a balanced, or quadrature, amplifier including an in-phase amplifier leg 50 and a quadrature-phase amplifier leg 52. A radio frequency (RF) input signal ($RF_{IN}$) from the modulator 34 (FIG. 1) is provided to a quadrature splitter 54. In this embodiment, the quadrature splitter 54 includes a power splitter 56 and phase-shift circuits 58 and 60. The power splitter 56 splits the RF input signal ($RF_{IN}$) into two signals having essentially the same power. A first of these two signals may be processed by the −45 degree phase-shift circuit 58 to provide an in-phase input signal ($I_{IN}$), and a second of these two signals may be processed by the +45 degree phase-shift circuit 60 to provide a quadrature-phase input signal ($Q_{IN}$).

The in-phase input signal ($I_{IN}$) is provided to the in-phase amplifier leg 50, and the quadrature-phase input signal ($Q_{IN}$) is provided to the quadrature-phase amplifier leg 52. The in-phase amplifier leg 50 includes an input amplifier stage 62, an intermediate amplifier stage 64, and a final amplifier stage 66. It should be noted that while three amplifier stages are shown, the in-phase amplifier leg 50 may include any number of amplifier stages. Similarly, the quadrature-phase amplifier leg 52 includes an input amplifier stage 68, an intermediate amplifier stage 70, and a final amplifier stage 72. Again, while three amplifier stages are shown, the quadrature-phase amplifier leg 52 may also include any number of amplifier stages.

In-phase and quadrature-phase output signals ($I_{OUT}$, $Q_{OUT}$) of the amplifier legs 50 and 52 are provided to a quadrature combiner 74, which combines the output signals ($I_{OUT}$, $Q_{OUT}$) to provide an RF output signal ($RF_{OUT}$) to the matching network 38 (FIG. 1). In one embodiment, the quadrature combiner 74 may be implemented using phase-shift circuits 76 and 78 and a power combiner 80. In general, the +45 degree phase-shift circuit 76 operates to shift the phase of the in-phase output signal ($I_{OUT}$) by +45 degrees such that the in-phase output signal ($I_{OUT}$) has essentially a 0 degree phase-shift with respect to the RF input signal ($RF_{IN}$). The −45 degree phase-shift circuit 78 operates to shift the phase of the quadrature-phase output signal ($Q_{OUT}$) by −45 degrees such that the quadrature-phase output signal ($Q_{OUT}$) has essentially a 0 degree phase-shift with respect to the RF input signal ($RF_{IN}$). As a result, the phase-shifted in-phase and quadrature-phase output signals ($I_{OUT}$, $Q_{OUT}$) are in-phase and are combined by the power combiner 80 to provide the RF output signal ($RF_{OUT}$). Note that the power combiner 80 may be, for example, a resistive power combiner or a Wilkinson power combiner.

As the load impedance seen at the antenna 16 (FIG. 1) varies, the output of the power amplifier circuitry 36 and the currents through the amplifier legs 50 and 52 also vary. However, since the power amplifier circuitry 36 is a balanced amplifier, the total current drawn by the final amplifier stages 66 and 72 is relatively constant as the load impedance varies for a given output power level, as will be apparent to one of ordinary skill in the art upon reading this disclosure. More specifically, when the quadrature splitter 54 divides the input signal into two equal amplitude outputs and the amplifier legs 50 and 52 are of comparable design, the output return loss (S22) of the power amplifier circuitry 36 is defined as |S22|=0.5×|S22a−S22b|, where S22a is the output return loss of the in-phase amplifier leg 50, and S22b is the output return loss of the quadrature-phase amplifier leg 52. Thus, when the amplifier legs 50 and 52 are matched, the output return losses (S22a, S22b) of the amplifier legs 50 and 52 are approximately equal, and the output return loss (S22) of the power amplifier circuitry 36 is approximately zero. As a result, even though the currents in the amplifier legs 50 and 52 vary, the total current drawn by the final amplifier stages 66 and 72 is relatively constant as the load impedance varies for a given output power level. As such, a power detection system 82 is tolerant to varying Voltage Standing Wave Ratio (VSWR) conditions.

According to this embodiment of present invention, the power detection system 82 is coupled to the outputs of the in-phase and quadrature-phase amplifier legs 50 and 52, and operates to generate a quadrature power detection signal ($P_{DET,I}$, $P_{DET,Q}$). The power detection system 82 operates in either a forward power detection mode or a reverse power detection mode of operation. In the forward power detection mode of operation, the power detection signal ($P_{DET,I}$, $P_{DET,Q}$) is indicative of forward power. In the reverse power detection mode of operation, the power detection signal ($P_{DET,I}$, $P_{DET,Q}$) is indicative of reverse power.

Optionally, the power detection system 82 includes attenuators 84 and 86 operating to attenuate the output signals ($I_{OUT}$, $Q_{OUT}$) such that attenuated output signals are provided to first and second quadrature downconversion circuitry 88 and 90. Note that the attenuators 84 and 86 as well as the following alternatives are optional depending on the particular implementation. As an alternative, the attenuators 84 and 86 may be replaced by amplifiers. As yet another alternative, the attenuators 84 and 86 may be replaced by both attenuators and amplifiers where the in-phase and quadrature-phase output signals ($I_{OUT}$, $Q_{OUT}$) are amplified at low output power levels, attenuated at high output power levels, and optionally neither attenuated or amplified at intermediate output power levels. Whether the in-phase and quadrature-phase output signals ($I_{OUT}$, $Q_{OUT}$) are attenuated, amplified, or neither attenuated or amplified depends on the particular implementation. For example, if the power amplifier circuitry 36 has a large dynamic range, which may be the case for a 3G Wideband Code Division Multiple Access (W-CDMA) system, the in-phase and quadrature-phase output signals ($I_{OUT}$, $Q_{OUT}$) may be amplified at low output power levels and attenuated at high output power levels. In contrast, if the power amplifier circuitry 36 has a sufficiently small dynamic range, the in-phase and quadrature-phase output signals ($I_{OUT}$, $Q_{OUT}$) may be attenuated.

The in-phase and quadrature-phase output signals ($I_{OUT}$, $Q_{OUT}$) are then provided to the first and second quadrature downconversion circuitry 88 and 90. As illustrated, the first quadrature downconversion circuitry 88 includes mixers 92 and 94 and operates to downconvert the in-phase and quadrature-phase output signals ($I_{OUT}$, $Q_{OUT}$) to either baseband or a desired Intermediate Frequency (IF) based on an in-phase local oscillator signal ($I_{LO}$), thereby providing output signals $V_{II}$ and $V_{QI}$. The second quadrature downconversion circuitry 90 includes mixers 96 and 98 and operates to downconvert the in-phase and quadrature-phase output signals ($I_{OUT}$, $Q_{OUT}$) to either baseband or the desired IF based on a quadrature-phase local oscillator signal ($Q_{LO}$), which is essentially −90 degree out-of-phase with the in-phase local oscillator signal ($I_{LO}$), thereby providing output signals $V_{IQ}$ and $V_{QQ}$. As a result, the output signals of the second quadrature downconversion circuitry 90 are phase-shifted by essentially +90 degrees with respect to the corresponding output signals of the first quadrature downconversion circuitry 88. As described below, this +90 degree phase-shift enables generation of a forward power detection signal and a reverse power detection signal by selectively combining the outputs of the first and second quadrature downconversion circuitry 88 and 90.

More specifically, first combiner circuitry 100 operates to either add or subtract the output signals $V_{II}$ and $V_{QQ}$ depending on the mode of operation. Likewise, second combiner circuitry 102 operates to either add or subtract the output signals $V_{QI}$ and $V_{IQ}$ depending on the mode of operation. As discussed below in more detail, in the forward power detection mode of operation, the first combiner circuitry 100 is configured to subtract the output signal $V_{QQ}$ from the output signal $V_{II}$ to provide an in-phase signal indicative of forward power. The second combiner circuitry 102 is configured to add the output signals $V_{QI}$ and $V_{IQ}$ to provide a quadrature-phase signal indicative of forward power. The outputs of the first and second combiner circuitry 100 and 102 are optionally amplified by variable gain amplifiers 104 and 106 and digitized by A/D converters 108 and 110, respectively, to provide quadrature power detection signal ($P_{DET,I}$, $P_{DET,Q}$), where the quadrature power detection signal ($P_{DET,I}$, $P_{DET,Q}$) is indicative of forward power.

In the reverse power detection mode of operation, the first combiner circuitry 100 is configured to add the output signals $V_{II}$ and $V_{QQ}$ to provide an in-phase signal indicative of reverse power. The second combiner circuitry 102 is configured to subtract the output signal $V_{IQ}$ from the output signal $V_{QI}$ to provide a quadrature-phase signal indicative of reverse power. The outputs of the first and second combiner circuitry 100 and 102 are optionally amplified by the variable gain amplifiers 104 and 106 and digitized by the A/D converters 108 and 110, respectively, to provide the digital quadrature power detection signal ($P_{DET,I}$, $P_{DET,Q}$), where the digital quadrature power detection signal ($P_{DET,I}$, $P_{DET,Q}$) is indicative of reverse power.

The operation of the power detection system 82 may be mathematically described as follows. Let the RF input signal ($RF_{IN}$) applied to the power amplifier circuitry 36 be:

$$V_{RFin}(t) = A_m(t)\cos(\omega_c t + \phi_m(t)) \tag{1}$$

where $A_m$ and $\phi_m$ are the modulated amplitude and phase, $\omega_c$ is the carrier frequency, and t is time. Due to a finite return loss between the transmitter and the antenna, the nodes $I_a$ and $Q_a$ consist of both forward and reverse signals and may be defined as:

$$V_{Ia}(t) = V_{FwIa}(t) + V_{RvIa}(t) \tag{2}$$

$$V_{Qa}(t) = V_{FwQa}(t) + V_{RvQa}(t) \tag{3}$$

where $$V_{FwIa}(t) = A_{IPA} A_m(t)\cos(\omega_c t - 45 + \phi_m(t)) \tag{4}$$

$$V_{FwQa}(t) = A_{QPA} A_m(t)\cos(\omega_c t + 45 + \phi_m(t)) \tag{5}$$

$$V_{RvIa}(t) = |\Gamma| A_{IPA} A_m(t)\cos(\omega_c t + 45 + \phi_m(t) + \phi_\Gamma) \tag{6}$$

$$V_{RvQa}(t) = |\Gamma| A_{QPA} A_m(t)\cos(\omega_c t - 45 + \phi_m(t) + \phi_\Gamma) \tag{7}$$

where $A_{IPA}$ and $A_{QPA}$ are the gain in the in-phase and quadrature-phase amplifier legs 50 and 52 of the power amplifier circuitry 36, respectively, and $|\Gamma|$ and $\phi_\Gamma$ are the magnitude and phase of the reflection coefficient at the output of the power amplifier circuitry 36. Equations 4-7 display how forward and reverse power can be separated by taking note that the forward and reverse signals at $I_a$ and $Q_a$ are in quadrature. Thus, these signals can be downconverted using quadrature local oscillator signals and selectively combined to determine forward power, reverse power, or both forward and reverse power.

The in-phase and quadrature-phase quadrature local oscillator signals $I_{LO}$ and $Q_{LO}$ may be defined as:

$$V_{ILO}(t) = A_{ILO}\cos(\omega_c t + \phi_{LO}) \tag{8}$$

$$V_{QLO}(t) = A_{QLO}\cos(\omega_c t - 90 + \phi_{LO}) \tag{9}$$

where $A_{ILO}$, $A_{QLO}$, and $\phi_{LO}$ are the amplitude and phase of the local oscillator signals. In this example, the RF signals are downconverted to baseband, or DC. Thus, the RF and LO frequencies are equal. However, the RF signals may alternatively be downconverted to a desired Intermediate Frequency (IF).

By multiplying Equations 2-3 by Equations 8-9 in the manner illustrated in FIG. 2 and by ignoring high frequency components, the output signals $V_{II}$, $V_{QI}$, $V_{IQ}$, and $V_{QQ}$ output by the first and second quadrature downconversion circuitry 88 and 90 may be defined as:

$$V_{II}(t) = A_{Fw\_II}(t)\cos(-45 + \phi_m(t) - \phi_{LO}) + A_{Rv\_II}(t)\cos(+45 + \phi_m(t) + \phi_\Gamma - \phi_{LO}) \tag{10}$$

$$V_{QI}(t) = A_{Fw\_QI}(t)\cos(+45 + \phi_m(t) - \phi_{LO}) + A_{Rv\_QI}(t)\cos(-45 + \phi_m(t) + \phi_\Gamma - \phi_{LO}) \tag{11}$$

$$V_{IQ}(t) = A_{Fw\_IQ}(t)\cos(+45 + \phi_m(t) - \phi_{LO}) + A_{Rv\_IQ}(t)\cos(+135 + \phi_m(t) + \phi_\Gamma - \phi_{LO}) \tag{12}$$

$$V_{QQ}(t) = A_{Fw\_QQ}(t)\cos(+135 + \phi_m(t) - \phi_{LO}) + A_{Rv\_QQ}(t)\cos(+45 + \phi_m(t) + \phi_\Gamma - \phi_{LO}) \tag{13}$$

where $A_{Fw\_II} = 0.5 A_{AttenI} A_{IImix} A_{IPA} A_m$ and $A_{Rv\_II} = |\Gamma| A_{Fw\_II}$. The gain of each of the mixers 92-98 is denoted by $A_{XXmix}$, where XX is either II, QI, IQ, or QQ. Note that, in one embodiment, the transfer functions of the mixers 92-98 are such that the high frequency components resulting from the mixing operation are filtered.

By inspecting Equations 10-13, it can be seen that the forward power detection can be achieved by subtracting $V_{II}(t)$ and $V_{QQ}(t)$ and summing $V_{QI}(t)$ and $V_{IQ}(t)$. Likewise, reverse power detection can be achieved by summing $V_{II}(t)$ and $V_{QQ}(t)$ and subtracting $V_{QI}(t)$ and $V_{IQ}(t)$. More specifically, $$V_{I\_Fw}(t) = V_{II}(t) - V_{QQ}(t) = A_{VGA\_I}(A_{Fw\_II} + A_{Fw\_QQ})\cos(-45 + \phi_m(t) - \phi_{LO}) \tag{14}$$

$$V_{Q\_Fw}(t) = V_{QI}(t) - V_{IQ}(t) = A_{VGA\_Q}(A_{Fw\_QI} + A_{Fw\_IQ})\cos(+45 + \phi_m(t) - \phi_{LO}) \tag{15}$$

$$V_{I\_Rv}(t) = V_{II}(t) + V_{QQ}(t) = A_{VGA\_I}(A_{Rv\_II} + A_{Rv\_QQ})\cos(+45 + \phi_m(t) + \phi_\Gamma - \phi_{LO}) \tag{16}$$

$$V_{Q\_Rv}(t) = V_{QI}(t) - V_{IQ}(t) = A_{VGA\_Q}(A_{Rv\_QI} + A_{Rv\_IQ})\cos(-45 + \phi_m(t) + \phi_\Gamma - \phi_{LO}) \tag{17}$$

where $V_{I\_Fw}(t)$ and $V_{Q\_Fw}(t)$ are output by the variable gain amplifiers 104 and 106, respectively, and form an analog quadrature power detection signal in the forward power detection mode of operation, and $V_{I\_Rv}(t)$ and $V_{Q\_Rv}(t)$ are the outputs of the variable gain amplifiers 104 and 106, respectively, and form the analog quadrature power detection signal in the reverse power detection mode of operation.

$A_{VGA\_I}$ and $A_{VGA\_Q}$ are the gains of the variable gain amplifiers 104 and 106, respectively. The A/D converters 108 and 110 then digitize the analog quadrature power detection signals to provide the digital quadrature power detection signal ($P_{DET,I}$, $P_{DET,Q}$), respectively.

Based on the digital quadrature power detection signal ($P_{DET,I}$, $P_{DET,Q}$), the control system 22 may operate to control both forward and delivered power. Note that while the power detection system 82 of FIG. 2 detects both forward and reverse power, the power detection system 82 may alternatively be configured or implemented to detect only forward or reverse power. Further, while the power detection system 82 of FIG. 2 has a forward power detection mode and a reverse power detection mode of operation, the power detection system 82 may alternatively be implemented to concurrently detect both forward and reverse power. More specifically, as an example, the first and second combiner circuitry 100 and 102 and variable gain amplifiers 104 and 106 may be replaced by four amplifiers, where two of the combiners and two of the amplifiers operate to generate a first analog power detection signal indicative of forward power, and the other two combiners and the other two amplifiers operate to generate a second analog power detection signal indicative of reverse power.

As will be appreciated by one of ordinary skill in the art upon reading this disclosure, the digital quadrature power detection signal ($P_{DET,I}$, $P_{DET,Q}$) may be further processed by the control system 22, or alternatively some intermediate digital processing logic, to provide a signal proportional to forward power, a signal proportional to reverse power, or both a signal proportional to forward power and a signal proportional to reverse power. Alternatively, this processing may be performed in the analog domain prior to A/D conversion. For example, a diode detection circuit may be used to process the analog quadrature signal output by either the first and second combiner circuitry 100 and 102 or the variable gain amplifiers 104 and 106 to provide a quadrature signal that is proportional to, rather than merely indicative of, forward or reverse power, depending on the mode of operation.

Figure 3:
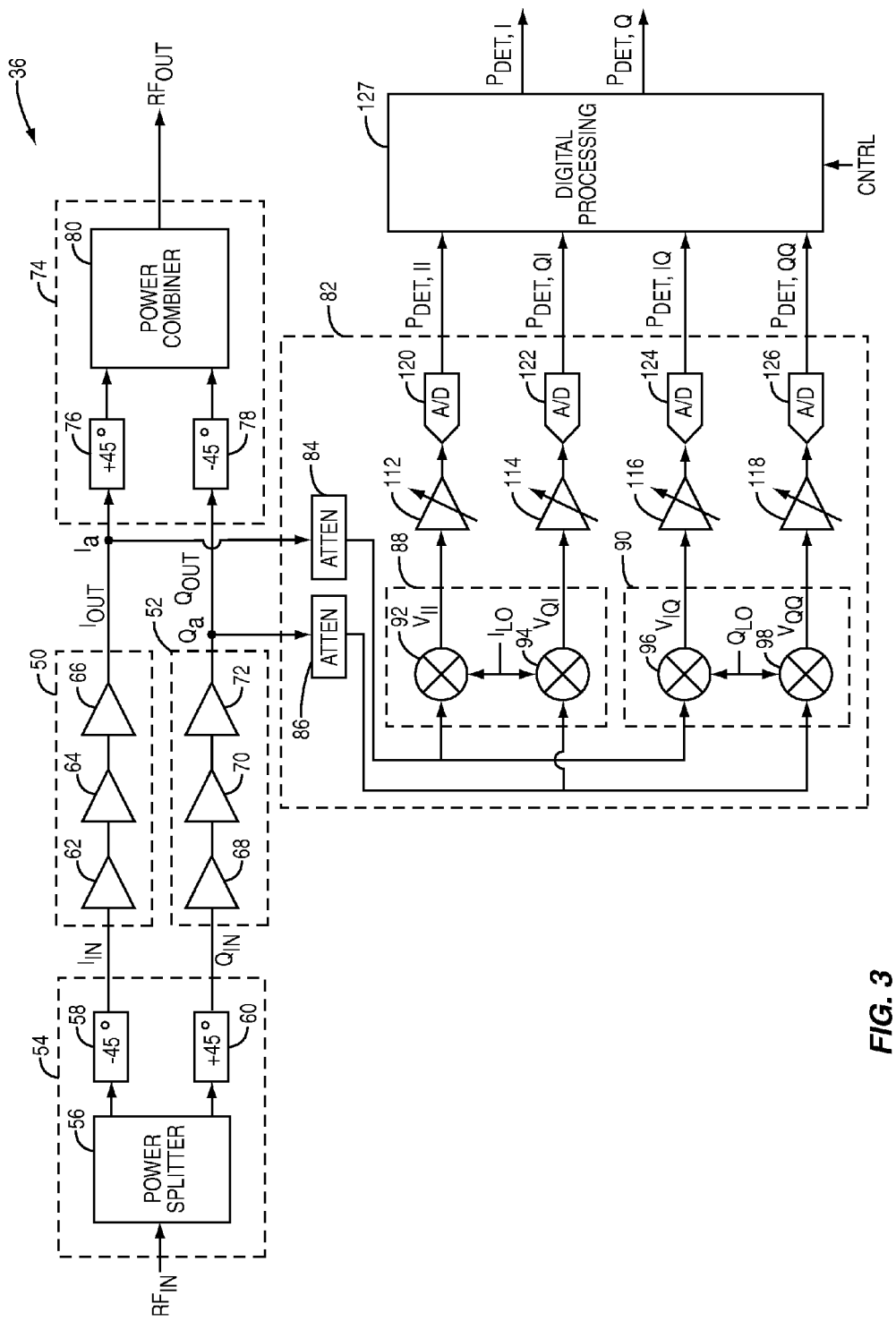
FIG. 3 illustrates power amplifier circuitry including a power detection system according to a second exemplary embodiment of the present invention.

As will be apparent to one of ordinary skill in the art, numerous variations may be made to the power detection system 82 without departing from the scope of the present invention. For example, FIG. 3 illustrates an a second embodiment of the power detection system 82 wherein the output signals ($V_{II}$, $V_{QI}$, $V_{IQ}$, and $V_{QQ}$) of the first and second quadrature downconversion circuitry 88 and 90 are optionally amplified by amplifiers 112-118 and then digitized by A/D converters 120-126 to provide power detection signals ($P_{DET,II}$, $P_{DET,QI}$, $P_{DET,IQ}$, $P_{DET,QQ}$). Thereafter, digital processing logic 127 subtracts $P_{DET,QQ}$ from $P_{DET,II}$ and adds $P_{DET,QI}$ and $P_{DET,IQ}$ to provide the digital quadrature power detection signal indicative of forward power when in a forward power detection mode as controlled by a control signal (CNTRL). Likewise, the digital processing logic 127 adds $P_{DET,II}$ and $P_{DET,QQ}$ and subtracts $P_{DET,IQ}$ from $P_{DET,QI}$ to provide the digital quadrature power detection signal indicative of reverse power when in a reverse power detection mode as controlled by the control signal (CNTRL). The control signal (CNTRL) may be provided by, for example, the control system 22. Alternatively, the control system 22, rather than the digital processing logic 127, may process the power detection signals ($P_{DET,II}$, $P_{DET,QI}$, $P_{DET,IQ}$, $P_{DET,QQ}$) to provide the quadrature power detection signals indicative of forward and reverse power.

Figure 4:
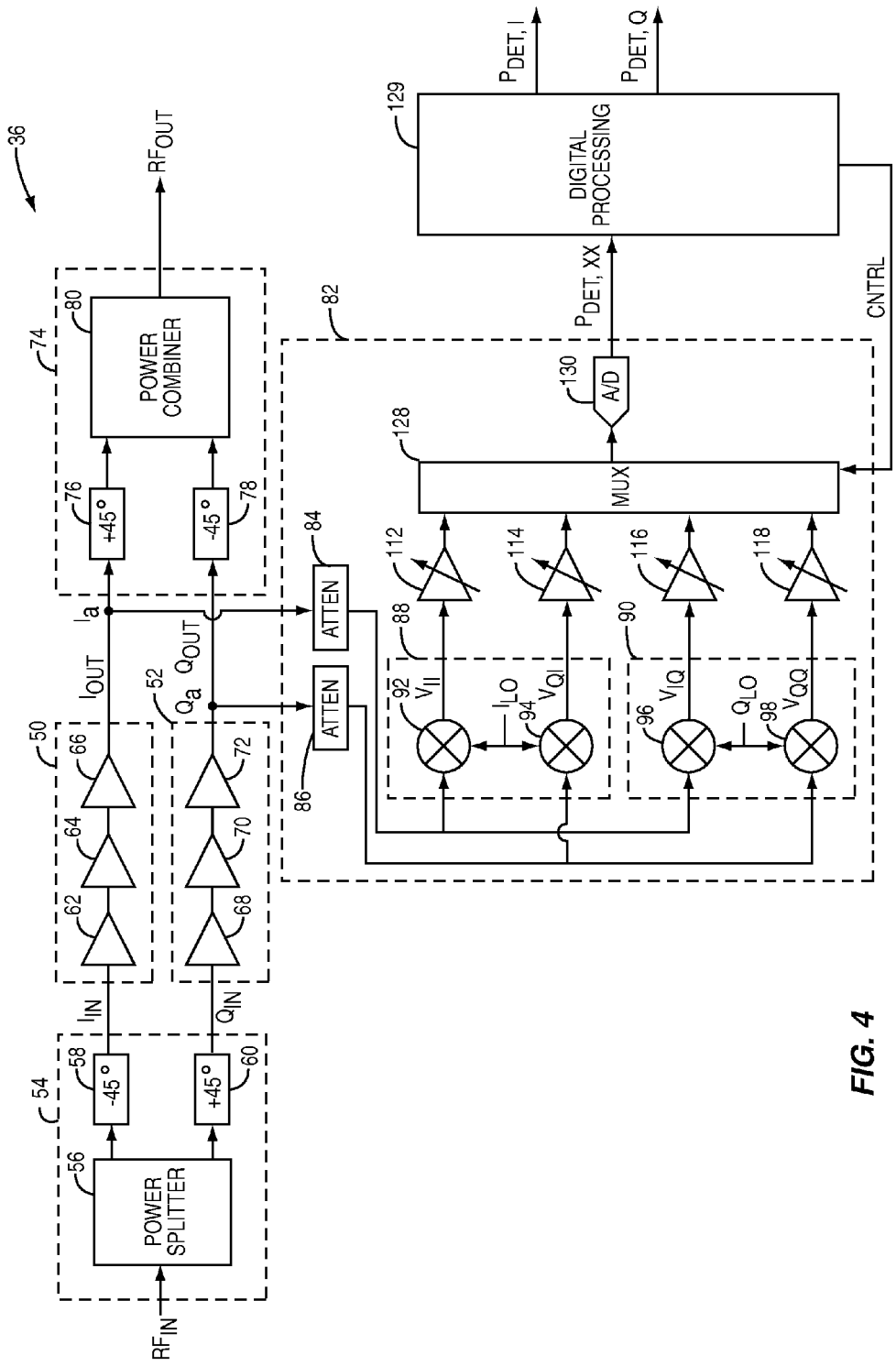
FIG. 4 illustrates power amplifier circuitry including a power detection system according to a third exemplary embodiment of the present invention.

FIG. 4 illustrates the power detection system 82 according to a third embodiment of the present invention. This embodiment is substantially the same as that in FIG. 3. However, multiplexing circuitry 128 is used to multiplex the amplified outputs of the first and second quadrature downconversion circuitry 88 and 90 into a single A/D converter 130. Digital processing logic 129, or alternatively the control system 22, may then control the multiplexing circuitry 128 to obtain the power detection signals ($P_{DET,II}$, $P_{DET,QI}$, $P_{DET,IQ}$, $P_{DET,QQ}$) and process the power detection signals ($P_{DET,II}$, $P_{DET,QI}$, $P_{DET,IQ}$, $P_{DET,QQ}$) to provide the digital quadrature power detection signals indicative of forward and reverse power. More specifically, the digital processing logic 129, or alternatively the control system 22, may then subtract $P_{DET,QQ}$ from $P_{DET,II}$ and add $P_{DET,QI}$ and $P_{DET,IQ}$ to provide the digital quadrature power detection signal indicative of forward power. Likewise, the digital processing logic 129, or alternatively the control system 22, may add $P_{DET,II}$ and $P_{DET,QQ}$ and subtract $P_{DET,IQ}$ from $P_{DET,QI}$ to provide the digital quadrature power detection signal indicative of reverse power.

While the discussion of FIGS. 2-4 above focuses on generating digital quadrature power detection signals, the present invention is not limited thereto. For example, regarding the embodiment of FIG. 3, the signals $P_{DET,II}$ and $P_{DET,QQ}$ may be combined, or added, to provide a single-ended signal indicative of reverse power. Likewise, the signals $P_{DET,QI}$ and $P_{DET,IQ}$ may be combined, or added, to provide a single-ended signal indicative of forward power.

Figure 5:
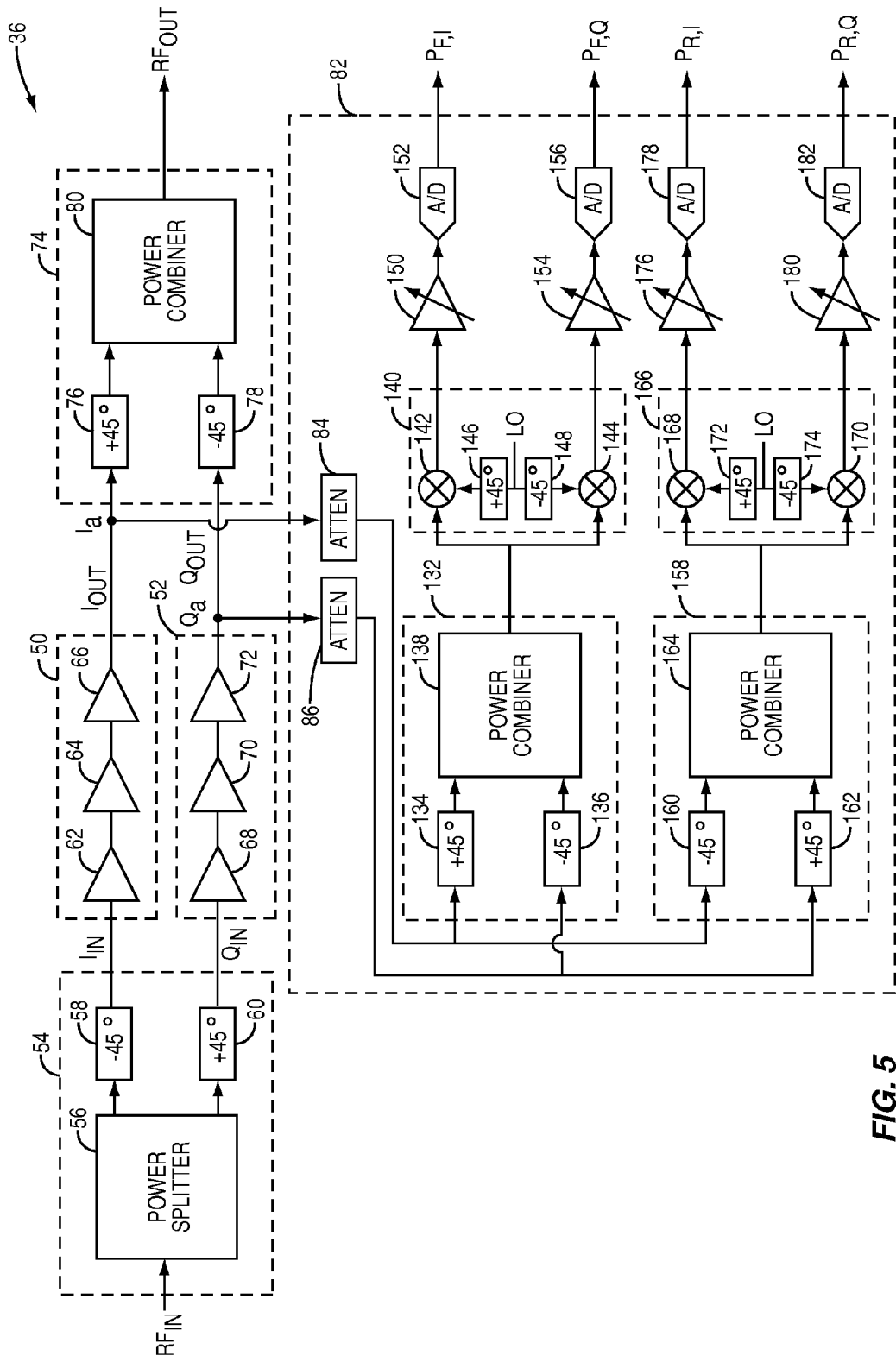
FIG. 5 illustrates power amplifier circuitry including a power detection system according to a fourth exemplary embodiment of the present invention.

FIG. 5 illustrates the power detection system 82 according to a fourth embodiment of the present invention. In this embodiment, forward power detection circuitry 132 operates to apply phase-shifting to the in-phase and quadrature-phase output signals ($I_{OUT}$, $Q_{OUT}$) at RF and combine the phase-shifted signals to provide an RF signal indicative of forward power. More specifically, in this embodiment, a phase-shift circuit 134 applies a +45 degree phase-shift to the in-phase output signal ($I_{OUT}$). In a similar fashion, a phase-shift circuit 136 applies a −45 degree phase-shift to the quadrature-phase output signal ($Q_{OUT}$). As a result, the reverse, or reflected, components of the phase-shifted in-phase and quadrature-phase output signals are essentially 180 degrees out-of-phase and therefore cancel when combined by a power combiner 138. Thus, the output of the power combiner 138 is an RF signal indicative of forward power.

The phase-shift circuits 134 and 136 may be implemented as resistor-capacitor (RC) or inductor-capacitor (LC) circuits, as will be apparent to one of ordinary skill in the art upon reading this disclosure. Alternatively, rather than using the phase-shift circuits 134 and 136, a 90 degree hybrid may be used. The power combiner 138 may be implemented as, for example, a Wilkinson power combiner, a resistive power combiner, or the like.

The output of the power combiner 138 is then downconverted to either baseband or a desired intermediate frequency (IF) by quadrature downconversion circuitry 140. The quadrature downconversion circuitry 140 includes mixers 142 and 144, which downconvert the output of the power combiner 138 using quadrature local oscillator signals provided by phase-shift circuits 146 and 148 based on a local oscillator signal (LO). The mixer 142 provides an analog in-phase forward power detection signal, which is optionally amplified by an amplifier 150 and digitized by an A/D converter 152 to provide a digital in-phase forward power detection signal ($P_{F,I}$). In a similar fashion, the mixer 144 provides an analog quadrature-phase forward power detection signal, which is optionally amplified by an amplifier 154 and digitized by an A/D converter 156 to provide a digital quadrature-phase forward power detection signal ($P_{F,Q}$). Together, the in-phase and quadrature-phase forward power detection signals form a quadrature forward power detection signal ($P_{F,I}$, $P_{F,Q}$).

The power detection system 82 may also include reverse power detection circuitry 158. The reverse power detection circuitry 158 applies phase-shifting to the in-phase and quadrature-phase output signals ($I_{OUT}$, $Q_{OUT}$) at RF and combines the phase-shifted signals to provide an RF signal indicative of reverse power. More specifically, in this embodiment, a phase-shift circuit 160 applies a −45 degree phase-shift to the in-phase output signal ($I_{OUT}$). In a similar fashion, phase-shift circuit 162 applies a +45 degree phase-shift to the quadrature-phase output signal ($Q_{OUT}$). As a result, the forward components of the phase-shifted in-phase and quadrature-phase output signals are essentially 180 degrees out-of-phase and therefore cancel when combined by a power combiner 164. Thus, the output of the power combiner 164 is an RF signal indicative of reverse power.

The phase-shift circuits 160 and 162 may be implemented as RC or LC circuits, as will be apparent to one of ordinary skill in the art upon reading this disclosure. Alternatively, rather than using the phase-shift circuits 160 and 162, a 90 degree hybrid may be used. The power combiner 164 may be implemented as, for example, a Wilkinson power combiner, a resistive power combiner, or the like.

The output of the power combiner 164 is then downconverted to either baseband or a desired intermediate frequency (IF) by quadrature downconversion circuitry 166. The quadrature downconversion circuitry 166 includes mixers 168 and 170, which downconvert the output of the power combiner 164 using quadrature local oscillator signals provided by phase-shift circuits 172 and 174 based on the local oscillator signal (LO). The mixer 168 provides an analog in-phase reverse power detection signal, which is optionally amplified by an amplifier 176 and digitized by an A/D converter 178 to provide a digital in-phase reverse power detection signal ($P_{R,I}$). In a similar fashion, the mixer 170 provides an analog quadrature-phase reverse power detection signal, which is optionally amplified by an amplifier 180 and digitized by an A/D converter 182 to provide a digital quadrature-phase reverse power detection signal ($P_{R,Q}$). Together, the in-phase and quadrature-phase reverse power detection signals form a quadrature reverse power detection signal ($P_{R,I}$, $P_{R,Q}$).

Figure 6:
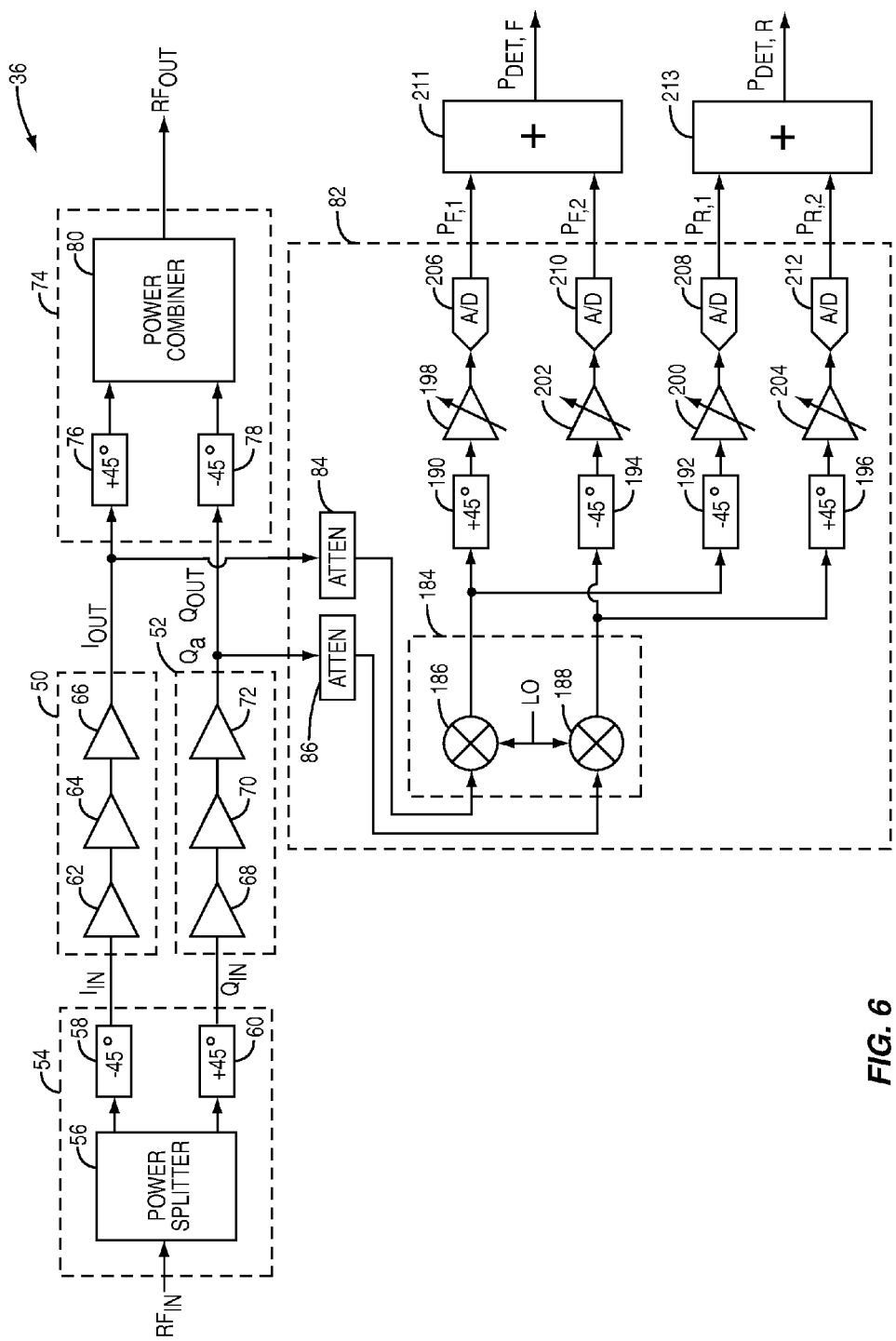
FIG. 6 illustrates power amplifier circuitry including a power detection system according to a fifth exemplary embodiment of the present invention.

FIG. 6 illustrates the power detection system 82 according to another embodiment of the present invention. This embodiment of the power detection system 82 is similar to that in FIG. 5. However, the in-phase and quadrature-phase output signals ($I_{OUT}$, $Q_{OUT}$) are downconverted to an intermediate frequency (IF) before phase-shifting. More specifically, the in-phase and quadrature-phase output signals ($I_{OUT}$, $Q_{OUT}$) are downconverted from RF to IF by quadrature downconversion circuitry 184. The quadrature downconversion circuitry 184 includes mixers 186 and 188. The mixer 186 downconverts the in-phase output signal ($I_{OUT}$) from RF to IF based on a local oscillator signal (LO). Likewise, the mixer 188 downconverts the quadrature-phase output signal ($Q_{OUT}$) from RF to IF based on the LO signal. The output of the mixer 186 is provided to phase-shift circuits 190 and 192, which apply a +45 degree and a −45 degree phase-shift, respectively. The output of the mixer 188 is provided to phase-shift circuits 194 and 196, which apply a −45 degree and a +45 degree phase-shift, respectively. The outputs of the phase-shift circuits 190-196 are optionally amplified by amplifiers 198-204 and digitized by A/D converters 206-212.

As a result of the phase-shifting, the reverse components of digital forward power detection signals ($P_{F,1}$, $P_{F,2}$) are essentially 180 degrees out-of-phase. Thus, in this embodiment, the digital forward power detection signals ($P_{F,1}$, $P_{F,2}$) may be combined by digital processing logic 211, or alternatively the control system 22, to provide a signal indicative of forward power. Alternatively, the outputs of the phase-shift circuits 190 and 194, or the outputs of the amplifiers 198 and 202, may be combined by a power combiner in the analog domain to provide an analog signal indicative of forward power. Likewise, the forward components of digital reverse power detection signals ($P_{R,1}$, $P_{R,2}$) are essentially 180 degrees out-of-phase. Thus, in this embodiment, the digital reverse power detection signals ($P_{R,1}$, $P_{R,2}$) may be combined by digital processing logic 213, or alternatively the control system 22, to provide a signal indicative of reverse power. Alternatively, the outputs of the phase-shift circuits 192 and 196, or the outputs of the amplifiers 200 and 204, may be combined by a power combiner in the analog domain to provide an analog signal indicative of reverse power.

Figure 7:
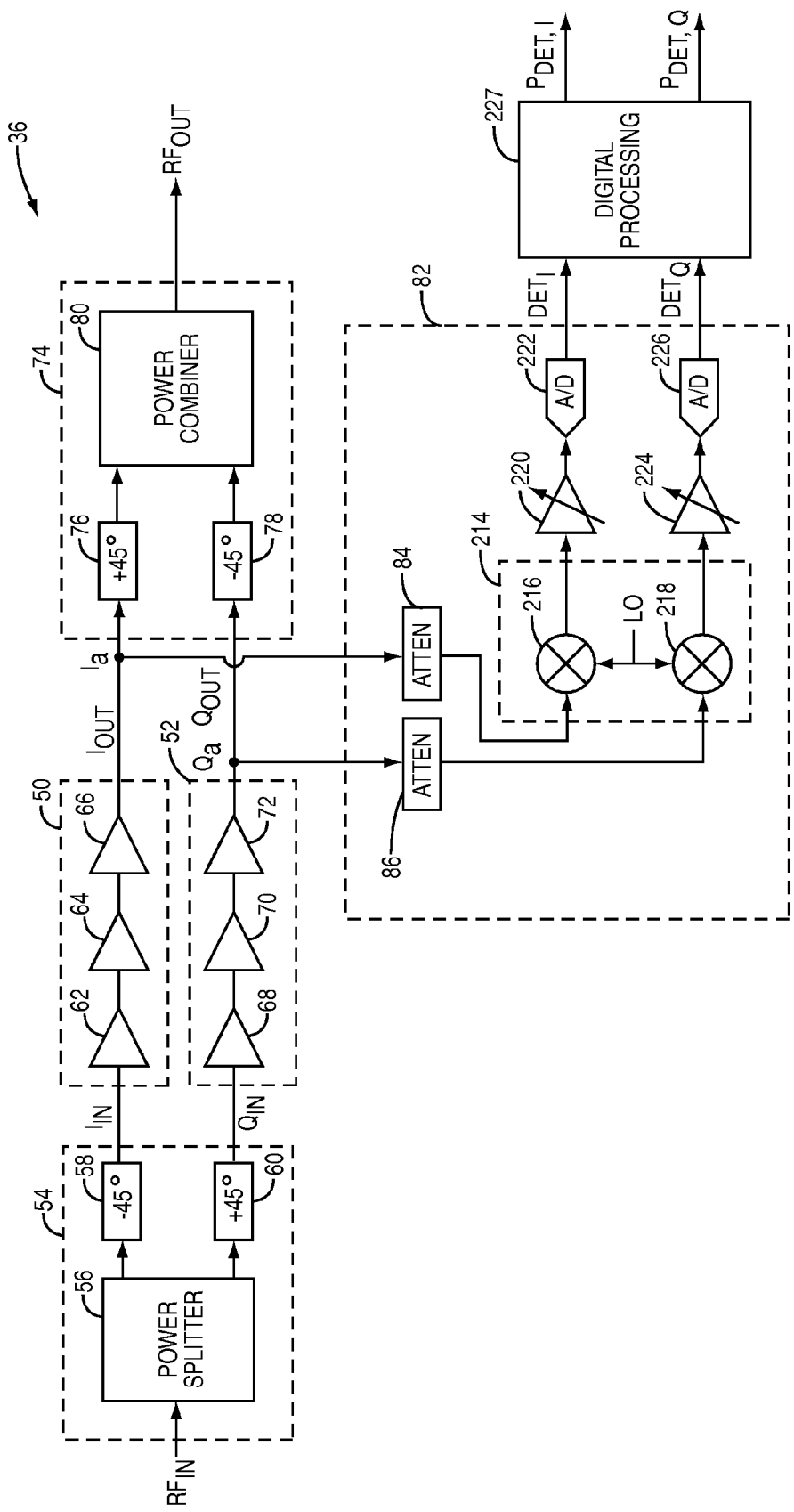
FIG. 7 illustrates power amplifier circuitry including a power detection system according to a sixth exemplary embodiment of the present invention.

FIG. 7 illustrates another embodiment of the power detection system 82. In this embodiment, after the optional attenuation, the in-phase and quadrature-phase output signals ($I_{OUT}$, $Q_{OUT}$) are downconverted by quadrature downconversion circuitry 214. The quadrature downconversion circuitry 214 includes mixers 216 and 218. The mixer 216 operates to downconvert the in-phase output signal ($I_{OUT}$) from RF to a desired Intermediate Frequency (IF) based on a local oscillator signal (LO). Likewise, the mixer 218 downconverts the quadrature-phase output signal ($Q_{OUT}$) from RF to a desired IF based on the LO signal. The output of the mixer 216 is then optionally amplified by an amplifier 220 and digitized by an A/D converter 222 to provide an in-phase power detection signal ($DET_I$). The output of the mixer 218 is optionally amplified by an amplifier 224 and digitized by an A/D converter 226 to provide a quadrature-phase power detection signal ($DET_Q$).

The power detection signals ($DET_I$, $DET_Q$) may then be phase-shifted and selectively combined in the digital domain by digital processing logic 227, or alternatively the control system 22, to provide a signal indicative of forward power, a signal indicative of reverse power, or both a signal indicative of forward power and a signal indicative of reverse power. More specifically, for forward power, a +45 degree phase-shift may be applied to the in-phase power detection signal ($DET_I$) and a −45 degree phase-shift may be applied to the quadrature-phase power detection signal ($DET_Q$) such that the reverse components of the two signals are essentially 180 degrees out-of-phase. Alternatively, a −90 degree phase-shift may be applied to the quadrature-phase power detection signal ($DET_Q$) or a +90 degree phase-shift may be applied to the in-phase power detection signal ($DET_I$). The two phase-shifted signals may then be combined to provide a signal ($P_{DET,I}$, $P_{DET,Q}$) indicative of forward power.

For reverse power, a −45 degree phase-shift may be applied to the in-phase power detection signal ($DET_I$) and a +45 degree phase-shift may be applied to the quadrature-phase power detection signal ($DET_Q$) such that the forward components of the two signals are essentially 180 degrees out-of-phase. Alternatively, a +90 degree phase-shift may be applied to the quadrature-phase power detection signal ($DET_Q$) or a −90 degree phase-shift may be applied to the in-phase power detection signal ($DET_I$). The two phase-shifted signals may then be combined to provide a signal ($P_{DET,I}$, $P_{DET,Q}$) indicative of reverse power.

The present invention provides substantial opportunity for variation without departing from the spirit or scope of the present invention. For example, as will be apparent to one of ordinary skill in the art, the quadrature power detection signal ($P_{DET,I}$, $P_{DET,Q}$) may be provided to a diode detector, where the output of the diode detector may then be provided to the control system 22 as a measure of forward or reverse power depending on the mode of operation. The same is true for the embodiments of the power detection system 82 illustrated in FIGS. 5 and 6. As another example, while +45 degree and −45 degree phase-shifts are discussed herein, any +45 degree and −45 degree phase-shift pair may alternatively be implemented using a 90 degree phase shift such as that provided by a 90 degree hybrid, as will be apparent to one of ordinary skill in the art upon reading this disclosure.

Those skilled in the art will recognize improvements and modifications to the preferred embodiments of the present invention. All such improvements and modifications are considered within the scope of the concepts disclosed herein and the claims that follow.

What is claimed is:

1. A power detection system for detecting output power of quadrature power amplifier circuitry comprising:
   a) first quadrature downconversion circuitry having a first input coupled to an output of an in-phase amplifier circuit of the quadrature power amplifier circuitry to receive an in-phase output signal and a second input coupled to an output of a quadrature-phase amplifier circuit of the quadrature power amplifier circuitry to receive a quadrature-phase output signal, and adapted to:
      i) downconvert the in-phase output signal based on a first local oscillator signal to provide a first downconverted signal; and
      ii) downconvert the quadrature-phase output signal based on the first local oscillator signal to provide a second downconverted signal;
   b) second quadrature downconversion circuitry having a first input coupled to the output of the in-phase amplifier circuit of the quadrature power amplifier circuitry to receive the in-phase output signal and a second input coupled to the output of the quadrature-phase amplifier circuit of the quadrature power amplifier circuitry to receive the quadrature-phase output signal, and adapted to:
      i) downconvert the in-phase output signal based on a second local oscillator signal that is essentially −90 degrees out-of-phase with the first local oscillator signal to provide a third downconverted signal; and
      ii) downconvert the quadrature-phase output signal based on the second local oscillator signal to provide a fourth downconverted signal; and
   c) circuitry adapted to selectively combine the first, second, third, and fourth downconverted signals to provide at least one of a group consisting of: a signal indicative of forward power and a signal indicative of reverse power.

2. The system of claim 1 wherein the circuitry adapted to selectively combine the first, second, third, and fourth downconverted signals comprises:
   first combination circuitry adapted to subtract the fourth downconverted signal from the first downconverted signal such that reverse components of the first and fourth downconverted signals essentially cancel to provide an in-phase signal indicative of forward power; and
   second combination circuitry adapted to add the second and third downconverted signals such that reverse components of the second and third downconverted signals essentially cancel to provide a quadrature-phase signal indicative of forward power;
   wherein the in-phase and quadrature-phase signals indicative of forward power are essentially 90 degrees out-of-phase and provide a quadrature signal indicative of forward power.

3. The system of claim 1 wherein the circuitry adapted to selectively combine the first, second, third, and fourth downconverted signals comprises:
   first combination circuitry adapted to add the first and fourth downconverted signals such that forward components of the first and fourth downconverted signals essentially cancel to provide an in-phase signal indicative of reverse power; and
   second combination circuitry adapted to subtract the third downconverted signal from the second downconverted signal such that forward components of the second and third downconverted signals essentially cancel to provide a quadrature-phase signal indicative of reverse power;
   wherein the in-phase and quadrature-phase signals indicative of reverse power are essentially 90 degrees out-of-phase and provide a quadrature signal indicative of reverse power.

4. The system of claim 1 wherein the circuitry adapted to selectively combine the first, second, third, and fourth downconverted signals comprises:
   first configurable combination circuitry; and
   second configurable combination circuitry;
   wherein in a forward power detection mode of operation:
      the first configurable combination circuitry is configured to subtract the fourth downconverted signal from the first downconverted signal such that reverse components of the first and fourth downconverted signals essentially cancel to provide an in-phase signal indicative of forward power; and
      the second configurable combination circuitry is configured to add the second and third downconverted signals such that reverse components of the second and third downconverted signals essentially cancel to provide a quadrature-phase signal indicative of forward power, wherein the in-phase and quadrature-phase signals indicative of forward power are essentially 90 degrees out-of-phase and provide a quadrature signal indicative of forward power; and
   in a reverse power detection mode of operation:
      the first configurable combination circuitry is configured to add the first and fourth downconverted signals such that forward components of the first and fourth downconverted signals essentially cancel to provide an in-phase signal indicative of reverse power; and
      the second configurable combination circuitry is configured to subtract the third downconverted signal from the second downconverted signal such that forward components of the second and third downconverted signals essentially cancel to provide a quadrature-phase signal indicative of reverse power, wherein the in-phase and quadrature-phase signals indicative of reverse power are essentially 90 degrees out-of-phase and provide a quadrature signal indicative of reverse power.

5. The system of claim 1 further comprising:
   first attenuation circuitry adapted to attenuate the in-phase output signal and provide the attenuated in-phase output signal to the first and second quadrature downconversion circuitry; and second attenuation circuitry adapted to attenuate the quadrature-phase output signal and provide the attenuated quadrature-phase output signal to the first and second quadrature downconversion circuitry.

6. The system of claim 1 wherein the circuitry adapted to selectively combine the first, second, third, and fourth downconverted signals comprises:
digitization circuitry adapted to digitize the first, second, third, and fourth downconverted signals; and
a digital control system adapted to selectively combine the digitized first, second, third, and fourth downconverted signals to provide the signal indicative of forward power, the signal indicative of reverse power, or both the signal indicative of forward power and the signal indicative of reverse power.

7. The system of claim 6 wherein the digital control system is further adapted to:
subtract the digitized fourth downconverted signal from the digitized first downconverted signal such that reverse components of the digitized first and fourth downconverted signals essentially cancel to provide an in-phase signal indicative of forward power; and
add the digitized second and third downconverted signals such that reverse components of the digitized second and third downconverted signals essentially cancel to provide a quadrature-phase signal indicative of forward power;
wherein the in-phase and quadrature-phase signals indicative of forward power are essentially 90 degrees out-of-phase and provide a quadrature signal indicative of forward power.

8. The system of claim 6 wherein the digital control system is further adapted to:
add the digitized first and fourth downconverted signals such that forward components of the digitized first and fourth downconverted signals essentially cancel to provide an in-phase signal indicative of reverse power; and
subtract the digitized third downconverted signal from the digitized second downconverted signal such that forward components of the digitized second and third downconverted signals essentially cancel to provide a quadrature-phase signal indicative of reverse power;
wherein the in-phase and quadrature-phase signals indicative of reverse power are essentially 90 degrees out-of-phase and provide a quadrature signal indicative of reverse power.

9. The system of claim 1 wherein the circuitry adapted to selectively combine the first, second, third, and fourth downconverted signals comprises:
multiplexing circuitry adapted to multiplex the first, second, third, and fourth downconverted signals;
digitization circuitry adapted to digitize the multiplexed first, second, third, and fourth downconverted signals; and
a digital control system adapted to receive the digitized and multiplexed first, second, third, and fourth downconverted signals from the digitization circuitry and selectively combine the digitized and multiplexed first, second, third, and fourth downconverted signals to provide the signal indicative of forward power, the signal indicative of reverse power, or both the signal indicative of forward power and the signal indicative of reverse power.

10. The system of claim 1 wherein the circuitry selectively combines the first, second, third, and fourth downconverted signals to provide the signal indicative of forward power, and the output power of the quadrature power amplifier circuitry is controlled based on the signal indicative of forward power.

11. The system of claim 1 wherein the circuitry selectively combines the first, second, third, and fourth downconverted signals to provide the signal indicative of forward power and the signal indicative of reverse power, and the output power of the quadrature power amplifier circuitry is controlled based on the signals indicative of forward and reverse power.

12. A method of detecting output power of quadrature power amplifier circuitry comprising:
downconverting an in-phase output signal from an in-phase amplifier circuit of the quadrature power amplifier circuitry based on a first local oscillator signal to provide a first downconverted signal;
downconverting a quadrature-phase output signal from a quadrature-phase amplifier circuit of the quadrature power amplifier circuitry based on the first local oscillator signal to provide a second downconverted signal;
downconverting the in-phase output signal from the in-phase amplifier circuit of the quadrature power amplifier circuitry based on a second local oscillator signal that is essentially −90 degrees out-of-phase with the first local oscillator signal to provide a third downconverted signal;
downconverting the quadrature-phase output signal from the quadrature-phase amplifier circuit of the quadrature power amplifier circuitry based on the second local oscillator signal to provide a fourth downconverted signal; and
selectively combining the first, second, third, and fourth downconverted signals to provide one of a group consisting of: a signal indicative of forward power and a signal indicative of reverse power.

13. The method of claim 12 wherein selectively combining the first, second, third, and fourth downconverted signals comprises selectively combining the first, second, third, and fourth downconverted signals to provide a quadrature signal indicative of forward power.

14. The method of claim 12 wherein selectively combining the first, second, third, and fourth downconverted signals comprises selectively combining the first, second, third, and fourth downconverted signals to provide a quadrature signal indicative of reverse power.

15. The method of claim 12 wherein selectively combining the first, second, third, and fourth downconverted signals comprises selectively combining the first, second, third, and fourth downconverted signals to provide a quadrature signal indicative of forward power and a quadrature signal indicative of reverse power.

16. The method of claim 12 wherein selectively combining the first, second, third, and fourth downconverted signals comprises:
subtracting the fourth downconverted signal from the first downconverted signal such that reverse components of the first and fourth downconverted signals essentially cancel to provide an in-phase signal indicative of forward power; and
adding the second and third downconverted signals such that reverse components of the second and third downconverted signals essentially cancel to provide a quadrature-phase signal indicative of forward power;
wherein the in-phase and quadrature-phase signals indicative of forward power are essentially 90 degrees out-of-phase and provide a quadrature signal indicative of forward power.

17. The method of claim 12 wherein selectively combining the first, second, third, and fourth downconverted signals comprises:
- adding the first and fourth downconverted signals such that forward components of the first and fourth downconverted signals essentially cancel to provide an in-phase signal indicative of reverse power; and
- subtracting the third downconverted signal from the second downconverted signal such that forward components of the second and third downconverted signals essentially cancel to provide a quadrature-phase signal indicative of reverse power;
- wherein the in-phase and quadrature-phase signals indicative of reverse power are essentially 90 degrees out-of-phase and provide a quadrature signal indicative of reverse power.

18. The method of claim 12 further comprising:
- attenuating the in-phase output signal prior to downconverting the in-phase output signal based on the first and second local oscillator signals; and
- attenuating the quadrature-phase output signal prior to downconverting the quadrature-phase output signal based on the first and second local oscillator signals.

19. The method of claim 12 wherein selectively combining the first, second, third, and fourth downconverted signals comprises:
- digitizing the first, second, third, and fourth downconverted signals; and
- selectively combining the digitized first, second, third, and fourth downconverted signals in a digital control system to provide the signal indicative of forward power, the signal indicative of reverse power, or both the signal indicative of forward power and the signal indicative of reverse power.

20. The method of claim 12 wherein selectively combining the first, second, third, and fourth downconverted signals comprises:
- multiplexing the first, second, third, and fourth downconverted signals;
- digitizing the multiplexed first, second, third, and fourth downconverted signals; and
- selectively combining the digitized and multiplexed first, second, third, and fourth downconverted signals to provide the signal indicative of forward power, the signal indicative of reverse power, or both the signal indicative of forward power and the signal indicative of reverse power.

21. The method of claim 12 wherein selectively combining the first, second, third, and fourth downconverted signals comprises selectively combining the first, second, third, and fourth downconverted signals to provide the signal indicative of forward power, and the method further comprises controlling an output power of the quadrature power amplifier circuitry based on the signal indicative of forward power.

22. The method of claim 12 wherein selectively combining the first, second, third, and fourth downconverted signals comprises selectively combining the first, second, third, and fourth downconverted signals to provide the signal indicative of forward power and the signal indicative of reverse power, and the method further comprises controlling an output power of the quadrature power amplifier circuitry based on the signals indicative of forward and reverse power.

23. A power detection system for detecting output power of quadrature power amplifier circuitry comprising:
a) a forward power detection system having a first input coupled to an output of an in-phase amplifier circuit of the quadrature power amplifier circuitry to receive an in-phase output signal and a second input coupled to an output of a quadrature-phase amplifier circuit of the quadrature power amplifier circuitry to receive a quadrature-phase output signal, and comprising:
   i) phase-shifting circuitry adapted to apply a phase-shift to at least one of the in-phase output signal and the quadrature-phase output signal such that reverse components of the in-phase and quadrature-phase output signals are essentially 180 degrees out-of-phase; and
   ii) combiner circuitry adapted to combine phase-shifted in-phase and quadrature-phase output signals from the phase-shifting circuitry such that the reverse components essentially cancel, thereby providing a signal indicative of forward power; and
b) quadrature downconversion circuitry adapted to downconvert the signal indicative of forward power based on quadrature local oscillator signals to provide a quadrature signal indicative of forward power.

24. The system of claim 23 further comprising:
a reverse power detection system having a first input coupled to the output of the in-phase amplifier circuit of the quadrature power amplifier circuitry to receive the in-phase output signal and a second input coupled to the output of a quadrature-phase amplifier circuit of the quadrature power amplifier circuitry to receive the quadrature-phase output signal, and comprising:
   second phase-shifting circuitry adapted to apply a phase-shift to at least one of the in-phase output signal and the quadrature-phase output signal such that forward components of the in-phase and quadrature-phase output signals are essentially 180 degrees out-of-phase; and
   combiner circuitry adapted to combine phase-shifted in-phase and quadrature-phase output signals from the second phase-shifting circuitry such that the forward components essentially cancel, thereby providing a signal indicative of reverse power; and
second quadrature downconversion circuitry adapted to downconvert the signal indicative of reverse power based on the quadrature local oscillator signals to provide a quadrature signal indicative of reverse power.

25. A power detection system for detecting output power of quadrature power amplifier circuitry comprising:
a) downconversion circuitry having a first input coupled to an output of an in-phase amplifier circuit of the quadrature power amplifier circuitry to receive an in-phase output signal and a second input coupled to an output of a quadrature-phase amplifier circuit of the quadrature power amplifier circuitry to receive a quadrature-phase output signal, and adapted to downconvert the in-phase output signal and the quadrature-phase output signal based on a local oscillator signal;
b) phase-shifting circuitry adapted to apply a phase-shift to at least one of the downconverted in-phase and quadrature-phase output signals such that reverse components of the downconverted in-phase and quadrature phase output signals are essentially 180 degrees out-of-phase; and
c) circuitry adapted to combine the phase-shifted downconverted in-phase and quadrature-phase output signals such that the reverse components essentially cancel to provide a signal indicative of forward power.

26. The system of claim 25 further comprising:
second phase-shifting circuitry adapted to apply a phase-shift to at least one of the downconverted in-phase and quadrature-phase output signals such that forward components of the downconverted in-phase and quadrature phase output signals are essentially 180 degrees out-of-phase; and circuitry adapted to combine the phase-shifted downconverted in-phase and quadrature-phase output signals from the second phase-shifting circuitry such that the forward components essentially cancel to provide a signal indicative of reverse power.

* * * * *